(12) United States Patent
Oesterle et al.

(10) Patent No.: US 9,416,712 B2
(45) Date of Patent: Aug. 16, 2016

(54) THERMOELECTRIC MODULE WITH HEAT EXCHANGER

(71) Applicant: EBERSPÄCHER EXHAUST TECHNOLOGY GMBH & CO. KG, Neunkirchen (DE)

(72) Inventors: Jörg Oesterle, Laichingen (DE); Andreas Resch, Esslingen (DE); Sebastian Leicht, Bisingen (DE); Arnulf Spieth, Hochdorf (DE); Herve Tchamgoue, Esslingen (DE); Ralf Mohr, Heidelberg (DE)

(73) Assignee: EBERSPÄCHER EXHAUST TECHNOLOGY GMBH & CO. KG, Neunkirchen (DE)

( * ) Notice: Subject to any disclaimer, the term of this patent is extended or adjusted under 35 U.S.C. 154(b) by 0 days.

(21) Appl. No.: 14/410,306

(22) PCT Filed: Jun. 21, 2013

(86) PCT No.: PCT/EP2013/063023
§ 371 (c)(1),
(2) Date: Dec. 22, 2014

(87) PCT Pub. No.: WO2013/190105
PCT Pub. Date: Dec. 27, 2013

(65) Prior Publication Data
US 2015/0337712 A1 Nov. 26, 2015

(30) Foreign Application Priority Data

Jun. 22, 2012 (DE) .................. 10 2012 210 565

(51) Int. Cl.
*F01N 3/00* (2006.01)
*F01N 3/02* (2006.01)
(Continued)

(52) U.S. Cl.
CPC ........ *F01N 5/025* (2013.01); *F01N 5/02* (2013.01); *H01L 35/30* (2013.01); *Y02T 10/16* (2013.01)

(58) Field of Classification Search
CPC .......... F01N 5/02; F01N 5/025; H01L 35/30; Y02T 10/16
USPC .................................................. 60/298, 320
See application file for complete search history.

(56) References Cited

U.S. PATENT DOCUMENTS 3,269,872 A * 8/1966 Thompson .............. H01L 35/34
136/208
4,595,297 A * 6/1986 Liu .......................... G01K 7/04
165/158

(Continued)

FOREIGN PATENT DOCUMENTS

DE 10 2008 038 756 A1 2/2010
EP 1 203 923 A2 5/2002

(Continued)

*Primary Examiner* — Thomas Denion
*Assistant Examiner* — Diem Tran
(74) *Attorney, Agent, or Firm* — McGlew and Tuttle, P.C.

(57) ABSTRACT

A heat exchanger, for an exhaust gas system (5) of an internal combustion engine (1), includes a thermoelectric module (13), converting thermal energy into electrical energy, having a hot side (17) and a cold side (18). A cooling pipe (15), for a cooling fluid, is arranged on the cold side (18) and a heating pipe (16) for a heating fluid, is arranged on the hot side (17). The cooling pipe (15) and the heating pipe (16) are stacked with the thermoelectric module (13) in a stacking direction (19) and form a stack (20). The heat transfer within the stack (20) is improved with at least one of the pipes (15, 16) being curved toward the thermoelectric module (13) at an outer pipe face (26) and with the thermoelectric module (13) curved toward the pipe (15, 16) at an outer module face (27) facing the particular pipe (15, 16).

20 Claims, 4 Drawing Sheets

(51) Int. Cl.
*F01N 5/02* (2006.01)
*H01L 35/30* (2006.01)

(56) References Cited

U.S. PATENT DOCUMENTS 5,968,456 A * 10/1999 Parise .................... B01F 5/0614
422/109
8,881,513 B2 * 11/2014 Bruck .................... F01N 3/2053
60/298
9,003,784 B2 * 4/2015 Limbeck ................. H01L 35/30
136/201
9,021,795 B2 * 5/2015 Spieth ..................... F01N 5/025
60/320
2011/0311421 A1 * 12/2011 Backhaus-
Ricoult ............. B01D 53/9477
423/213.2

FOREIGN PATENT DOCUMENTS

| EP | 2 337 101 A2 | 6/2011 |
| EP | 2 378 578 A2 | 10/2011 |
| EP | 2 383 533 A2 | 11/2011 |
| JP | 2011-127606 A | 6/2011 |
| WO | 2007/026432 A1 | 3/2007 |
| WO | 2012/139978 A2 | 10/2012 |

* cited by examiner

THERMOELECTRIC MODULE WITH HEAT EXCHANGER

CROSS REFERENCE TO RELATED APPLICATIONS

This application is a United States National Phase Application of International Application PCT/EP2013/063023 filed Jun. 21, 2013 and claims the benefit of priority under 35 U.S.C. §119 of German Patent Application DE 10 2012 210 565.4 filed Jun. 22, 2012, the entire contents of which are incorporated herein by reference.

FIELD OF THE INVENTION

The present invention relates to a heat exchanger, in particular for an exhaust system of an internal combustion engine, preferentially in a motor vehicle. The present invention additionally relates to an internal combustion engine equipped with such a heat exchanger.

BACKGROUND OF THE INVENTION

In order to improve the energetic efficiency in internal combustion engines, in particular in vehicle applications, efforts are underway to utilize the heat energy, which is contained in the exhaust gas of the internal combustion engine. A possibility of utilizing the heat energy contained in the exhaust gas is utilizing so-called thermoelectric modules, which can convert a temperature difference into electric voltage or a heat flow into an electric current. Such thermoelectric modules operate according to the so-called Seebeck effect, which corresponds to an inversion of the so-called Peltier effect.

A thermoelectric module comprises a hot side and a cold side and can convert thermal energy, i.e. heat into electrical energy during operation. By feeding heat to the hot side and discharging heat on the cold side a heat flow can be conducted through the respective thermoelectric module which is converted into electric current in the thermoelectric module. In order to be able to supply the hot side with heat and the cold side with cold, a thermoelectric module can be practically integrated in a heat exchanger, which comprises at least one heating tube for conducting a heating fluid and at least one cooling tube for conducting a cooling fluid. The thermoelectric module is then arranged between such a heating tube and such a cooling tube so that the heating tube is located on the hot side of the respective thermoelectric module and the cooling tube on the cold side of the respective thermoelectric module. For this purpose, the heating tube, the thermoelectric module and the cooling tube are stacked onto one another in a stacking direction, thus forming a stack.

In the case of such heat exchangers, into which the at least one thermoelectric module is integrated, it has been shown that the heat transfer between the tubes and the respective thermoelectric module can be significantly improved when the stack is preloaded in the stacking direction. Through the preload, areal contacting materializes between the contact surfaces provided for contacting, which makes possible a largely homogeneous heat transfer over the respective contact area. Problematic in this case is that the heating tubes and the cooling tubes are practically produced with comparatively small wall thicknesses in order to improve the heat transport through the tube walls. However, the compressive strength of the tubes is reduced because of this. In order to be able to nevertheless realize the desired preload in the stack, different approaches are possible in principle. For example, support structures can be introduced into the tubes which stiffen the tubes from the inside. Additionally or alternatively, it is possible to concavely curve the tubes on their tube outside facing the respective thermoelectric module towards the thermoelectric module, wherein this curved outside during the clamping of the stack is compressed with a flat module outside facing the respective tube, as a result of which the curved tube outside is flattened and lies flat against the flat module outside.

With an excessive preload there is additionally the danger in principle that the tube outside buckles and because of this concavely curves towards the respective thermoelectric module, as a result of which contacting is largely cancelled out. In this case, too, support structures can be again arranged in the respective tube in order to avoid such buckling of the respective tube. Inserting support structures however is connected with comparatively major effort. In addition, quite close tolerances have to be maintained here so that the support structures can guarantee the desired geometry of the respective tube.

SUMMARY OF THE INVENTION

The present invention deals with the problem of stating an improved embodiment for a heat exchanger of the type mentioned at the outset and for an internal combustion engine equipped with such, which is characterized in particular that with a comparatively high reliability a relative high heat transfer between the respective thermoelectric module and the respective tube can be realized.

The invention is based on the general idea of curving at least one module outside, which in the stacking direction faces one of the tubes, towards the respective tube and to curve a tube outside of the adjacent tube which faces and is located opposite the curved or bent module outside towards the thermoelectric module in the same direction. In other words, the invention thus proposes to get away from the usual contacting between the receptive thermoelectric module and the receptive tube in a plane and instead realize contacting in a bent or curved area. Here it is additionally important that the curvature of the respective module outside is embodied in the same direction as the curvature of the associated tube outside. For example, at least one such tube outside can be convexly curved towards the adjacent thermoelectric module and the facing module outside of the adjacent thermoelectric module can then be concavely curved towards the tube. Additionally or alternatively, at least one such tube outside can be concavely curved towards the adjacent thermoelectric module and the associated module outside of the adjacent thermoelectric module can then be convexly curved towards the tube. Preferably, both outsides of the respective tubes are either convexly curved to the outside or concavely curved to the outside. Complementarily thereto, the outsides of the respective thermoelectric module are preferentially both curved either convexly to the outside or concavely to the outside. In principle, however, an embodiment is also conceivable in which on such a tube and/or in such a thermoelectric module the one outside is concavely curved to the outside while the other outside is convexly curved to the outside. Versions are also possible in which only one outside of the respective tube and/or of the respective thermoelectric module is concavely or convexly curved to the outside.

Through the in particular contacted outsides running along curved areas in the preloaded state the danger of buckling because of the preload can be reduced. In addition to this, the design according to the invention leads to a simplified assembly since the respective thermoelectric module and the respective tube because of the curved outsides center themselves relative to one another in a predetermined relative position.

According to an advantageous embodiment, the curvatures of the outsides facing one another can be selected so that with missing preload force, which in a preloaded state of the stack compresses the stack in a stacking direction, a curvature radius of the tube outside and a curvature radius of the module outside are different. According to a practical further development, the curvature radius of the tube outside in this case can be smaller with missing preload force than the curvature radius of the module outside. This is preferably the case in particular when the tube outside is convexly curved to the outside. In an embodiment, in which the tube outside is convexly curved to the outside it can be advantageous to select the curvature radius of the tube outside larger with missing preload force than that of the convex module outside. Through this design with different curvature radii it can be achieved that at least the tube outside during the generation of the preload force, namely practically reversibly, i.e. in an elastic or resilient region. Because of this, the preload and thus the heat transfer between the respective thermoelectric module and the respective tube can be improved.

According to a particularly advantageous embodiment, the convex or concave tube outside can be configured spring-elastically and through a preload force, which in a preloaded state of the heat exchanger compresses the stack in the stacking direction, is spring-elastically deformable namely in such a manner that the convex tube outside in the preloaded state has a larger curvature radius than in a relaxed state, in which the preload force is missing. In other words, the curvature provided in the respective tube outside is flattened during preloading so that its curvature radius increases. It is important in this case that in the preloaded state a convex curvature of the tube outside is retained. Alternatively, with concavely curved tube outside, it can be provided that the same in the preloaded state has a smaller curvature radius than in a relaxed state, in which the preload force is missing. In other words, the curvature provided in the respective tube outside is increased during the clamping, so that its curvature radius decreases. Important in this case is that a concave curvature of the tube outside is retained even in the preloaded state.

According to an advantageous further development, the curved module outside can be rigid compared with the curved tube outside, i.e. have a higher bending stiffness than the tube outside. As a consequence, the curved tube outside during the preloading of the stack deforms more strongly than the curved module outside. For example, the module outside can be produced from a bending-stiff material, for example from a ceramic material, while the respective tube is produced from a flexible material, for example from metal. In particular on the cold side, i.e. with the cooling tubes, a light metal can also be used in principle, while on the hot side, i.e. at the heating tubes, steel or stainless steel tubes are preferred. In principle, an embodiment is also conceivable in which the thermoelectric module compared with the receptive tube is configured in an elastic or flexible manner. In particular, an embodiment is also conceivable then in which the respective thermoelectric module in the relaxed state has flat outsides. During the preloading, the complete thermoelectric module can then deform elastically so that its outsides curve correspondingly and in the process hug the concavely or convexly curved tube outsides, so that in the preloaded state they make possible the desired flat contacting along curved contact areas.

In another embodiment it can be provided that in the preloaded state the curvature radius of the tube outside is substantially identical in size as the curvature radius of the module outside. Because of this, areal contacting between the respective thermoelectric module and the respective tube can be realized, which leads to a particularly homogeneous heat transfer. Here it is clear that no direct contact has to exist between the receptive module outside and the respective tube outside, indirect contacting for example via a heat conductive layer can rather be provided.

In another embodiment, the hot side and the cold side, at least with such a thermoelectric module, can each form such a curved module outside. Accordingly, both the adjacent cooling tube and also the adjacent heating tube then have at least one correspondingly curved tube outside each.

In another advantageous embodiment, the receptive curvature can be configured mirror-symmetrically with respect to a longitudinal center plane of the stack running parallel to the stacking direction. In this manner, the assembly is simplified since confusions can be avoided. At the same time, the production of the thermoelectric modules and the tubes is simplified because of this.

In a preferred embodiment it can be provided that the respective curved outside is curved in a cross-sectional plane running parallel to the stacking direction and perpendicular to a longitudinal direction of the stack and is linear in a longitudinal center plane running parallel to the stacking direction and perpendicular to a transverse direction of the stack. Because of this, a cylinder segment-shaped curvature is obtained for the respective outside. With this design, the receptive thermoelectric module can be positioned in different relative positions in the stack longitudinal direction relative to the respective tube.

In an alternative embodiment it can be provided that the respective curved outside is curved both in a cross-sectional plane running parallel to the stacking direction and perpendicularly to a longitudinal direction of the stack as well as in a longitudinal section plane running parallel to the stacking direction and perpendicularly to a transverse direction of the stack. Because of this a spherical segment-shaped curvature is obtained for the respective outside for same curvature radii in the longitudinal direction and in the transverse direction. If the curvature radii differ in the longitudinal direction and the transverse direction by contrast, an ellipsoid segment-shaped curvature is obtained for the respective outside. Through this measure, a single relative position to the respective tube is predefined for the respective thermoelectric module, which inevitably materializes through centering during the assembly.

According to an advantageous further development, multiple thermoelectric modules can be arranged in the longitudinal direction of the stack one behind the other between such a heating tube and such a cooling tube, wherein the module outsides of these thermoelectric modules in each case are curved in the cross-sectional plane and in the longitudinal section plane, wherein the respective tube comprises multiple longitudinal sections which are arranged in the stack longitudinal direction one behind the other, which are each assigned to a thermoelectric module and which are each curved in the cross-sectional plane and in the longitudinal section plane. Through this design, multiple thermoelectric modules can be exactly positioned between the receptive heating tube and the respective cooling tube, wherein the respective relative position automatically materializes through the centering effect of the spherical segment-shaped or ellipsoid segment-shaped curvatures.

In another advantageous embodiment it can be provided that in the stacking direction between the respective tube and the respective thermoelectric module a heat conductive layer is arranged. Such a heat conductive layer, which can be formed for example with the help of heat conductive paste or with the help of a graphite film, can improve the heat transfer between the outsides. In particular, minor variations in the gap between the outsides facing one another can be compensated with the help of such a heat conductive layer, which can develop because of component tolerances.

An internal combustion engine according to the invention, which can be preferentially arranged in a motor vehicle, comprises an engine block, which comprises multiple combustions chambers, an exhaust system for discharging exhaust gas from the combustion chambers, a cooling circuit for cooling the engine block and a heat exchanger of the type described above. Here, at least one heating tube of the heat exchanger is fluidically incorporated in the exhaust system, so that the exhaust gas serves as heating fluid. Furthermore, at least one cooling tube of the heat exchanger is fluidically incorporated in the cooling circuit, so that the coolant of the cooling circuit serves as cooling fluid. Alternatively, the respective cooling tube of the heat exchanger can be incorporated in an additional cooling circuit, which can be independent of the cooling circuit of the engine. This can be a low-temperature cooling circuit which is separate with respect to the engine cooling circuit, in which the temperature of the cooling medium remains below the coolant temperature of the engine cooling circuit, or a high-temperature cooling circuit which is separate with respect to the engine cooling circuit, in which the cooling medium temperature is in the range of the coolant temperature of the engine cooling circuit or above.

The heat exchanger can be additionally equipped with means for creating the preload. These means can for example be integrated in a housing of the heat exchanger. For example, the preload force can be created during the closing of the housing. It is likewise possible to provide a special preloading device which preloads the stack. Conceivable for example is an embodiment in which two plate bodies can be clamped relative to one another with the help of tie rods, wherein the stack is received between the plates.

It is to be understood that the features mentioned above and still to be explained in the following cannot only be used in the receptive combination stated but also in other combinations or by themselves without leaving the scope of the present invention.

Preferred exemplary embodiments of the invention are shown in the drawings and are explained in more detail in the following description, wherein same reference numbers relate to same or similar or functionally same components.

The present invention shall be explained in more detail on the basis of the following figures and exemplary embodiments, without the present invention being limited to these. The various features of novelty which characterize the invention are pointed out with particularity in the claims annexed to and forming a part of this disclosure. For a better understanding of the invention, its operating advantages and specific objects attained by its uses, reference is made to the accompanying drawings and descriptive matter in which preferred embodiments of the invention are illustrated.

DESCRIPTION OF THE PREFERRED EMBODIMENTS

Figure 1:
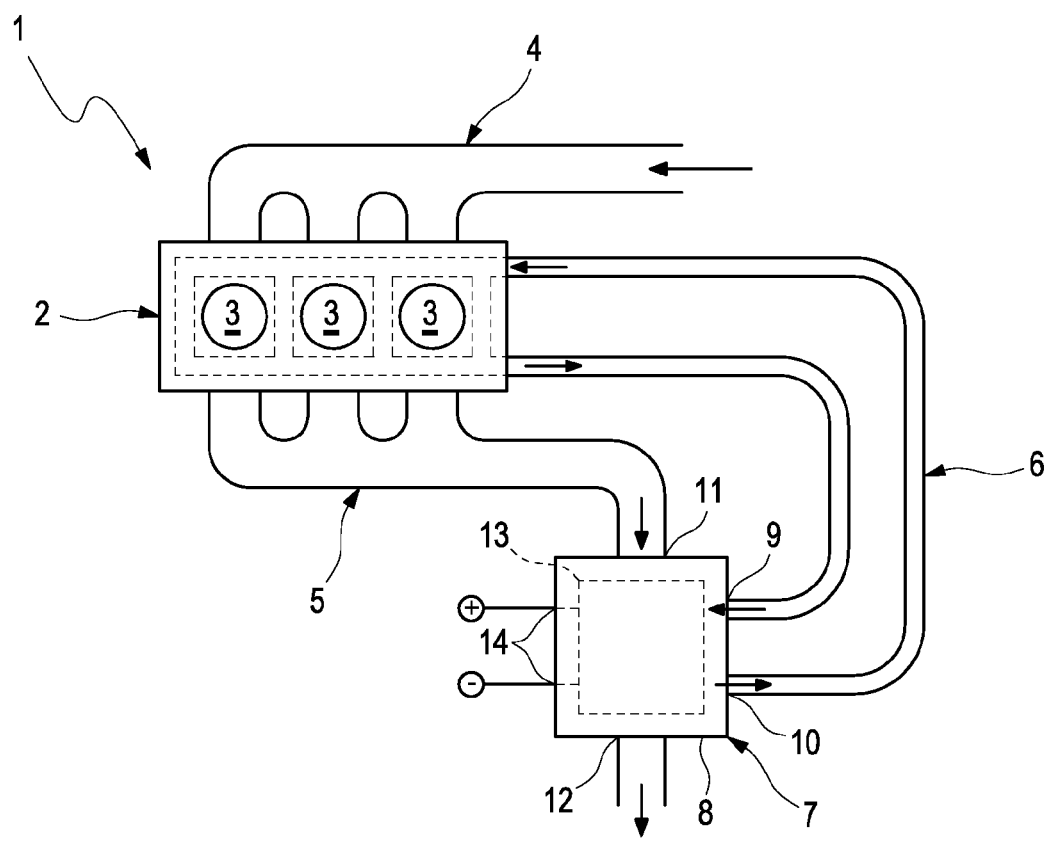
FIG. 1 is a highly simplified schematic representation in the manner of a circuit diagram of an internal combustion engine.

Referring to the drawings, according to FIG. 1, an internal combustion engine 1, which can preferably be employed in a motor vehicle, comprises an engine block 2, which contains multiple combustion chambers 3, a fresh air system 4 for supplying the combustion chambers 3 with fresh air and an exhaust system 5 for discharging exhaust gas from the combustion chambers 3. The internal combustion engine 1 furthermore is equipped with a cooling circuit 6, with the help of which the engine block 2 can be cooled. Here it is clear that in the cooling circuit 6 a radiator which is not shown here, if appropriate in conjunction with a fan, can be additionally provided, in order to be able to suitably cool the coolant carried in the cooling circuit 6. In another embodiment, a further cooling circuit which is not shown here can be additionally provided which can in particular be independent of the primary cooling circuit 6. This secondary cooling circuit in this case can be optionally operated at a temperature level other than that of the primary cooling circuit 6.

The internal combustion engine 1 is additionally equipped with a heat exchanger 7, the housing 8 of which comprises a cooling medium inlet 9, a cooling medium outlet 10, a heating medium inlet 11 and a heating medium outlet 12. Via its heating medium inlet 11, and its heating medium outlet 12, the heat exchanger 7 is fluidically incorporated in the exhaust system 5, wherein the exhaust gas serves as heating medium or heating fluid in the heat exchanger 7. Furthermore, via its cooling medium inlet 9 and its cooling medium outlet 10 the heat exchanger 7 is incorporated in a cooling circuit, the coolant of which also serves as cooling medium or as cooling fluid in the heat exchanger 7. According to FIG. 1, this can be the primary cooling circuit 6 or engine cooling circuit 6 or the secondary cooling circuit mentioned above but not shown here. The heat exchanger 7 additionally contains at least one thermoelectric module 13, which in the interior of the heat exchanger 7 is coupled to the heating fluid and to the cooling fluid in a heat-transferring manner. On the housing 8, electrical connections 14 are formed which are suitably electrically connected to the respective thermoelectric module 13.

Figure 2:
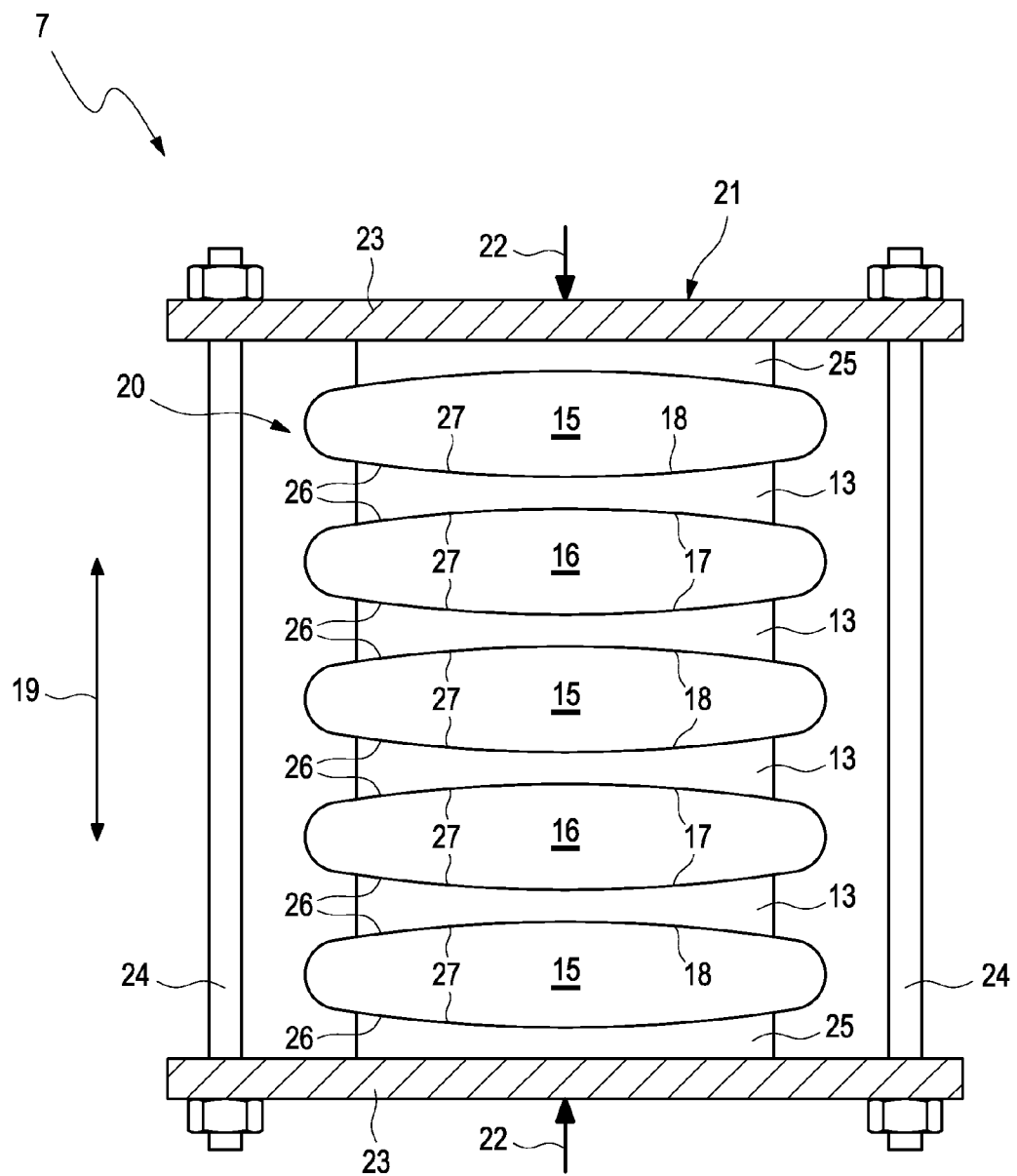
FIG. 2 is a highly simplified cross sectional view through a heat exchanger.

According to FIGS. 2 to 6, the respective heat exchanger 7 comprises at least one cooling tube 15 for conducting the cooling fluid and at least one heating tube 16 for conducting the heating fluid. The respective thermoelectric module 13 comprises a hot side 17 and a cold side 18. The respective cooling tube 15 is arranged on the cold side 18 of at least one such thermoelectric module 13. The respective heating tube 16 is arranged on the hot side 17 of at least one such thermoelectric module 13. The respective thermoelectric module 13, the receptive cooling tube 15 and the respective heating tube 16 are stacked onto one another in a stacking direction 19 and form a stack 20. In the example of FIG. 2, five tubes are provided, namely three cooling tubes 15 and two heating tubes 16, between which in altogether four planes at least one thermoelectric module 13 each is arranged. Practically, according to FIGS. 5 and 6, multiple thermoelectric modules 13 can be arranged in a longitudinal direction 35 of the stack 20 in the respective plane between a cooling tube 15 and a heating tube 16 each.

In FIGS. 2 to 6, the housing 8 of the heat exchanger 7 is not shown. Instead, a preloading device 21 is shown in FIG. 2 with the help of which a preload force 22 indicated by arrows can be introduced into the stack 20. This preloading force 22 in this case is oriented parallel to the stacking direction 19. In the example, the preloading device 21 comprises two end plates 23, which are clamped to one another in the stacking direction 19 via tie rods 24. Between the end plates 23, the stack 20 is received in order to introduce the preload force 22 into the stack 20. In the example of FIG. 2, the end plates 23 are supported on the respective cooling tube 15 located outside via adapter pieces 25.

In the embodiment of the heat exchanger 7 shown here, tube outsides 26, both regarding the cooling tubes 15 as well as regarding the heating tubes 16, which face the respective adjacent thermoelectric module 13, are convexly curved towards the respective thermoelectric module 13. Furthermore, module outsides 27, which face the tube outsides 26, are concavely curved towards the respective adjacent tube 15, 16. In another embodiment of the heat exchanger 7 which is not shown here, the tube outsides 26 both at the cooling tubes 15 and also at the heating tubes 16, which face the respective adjacent thermoelectric module 13, are concavely curved towards the respective thermoelectric module 13, while the module outsides 27, which face the tube outsides 26, are convexly curved towards the respective adjacent tube 15, 16. Furthermore, in a further embodiment which is not shown a mixed design is conceivable, which within the same heat exchanger 7 comprises at least one thermoelectric module 13 with convex module outsides 27 and at least one thermoelectric module 13 with concave modules outsides 27, wherein the associated tubes 15, 16 then have tube outsides 26 which are complementary thereto. An embodiment which is likewise not shown is also conceivable, in which at least one thermoelectric module 13 has a convex module outside 27 and a concave module outside 27, wherein the tubes 15, 16 here, too, have tube outsides 26 which are complementary thereto. In a further embodiment which is not shown, at least one of the thermoelectric modules can theoretically have a flat module outside 27. The following embodiments regarding the shown embodiment analogously apply also to the embodiments which are mentioned above but not shown.

Figure 3:
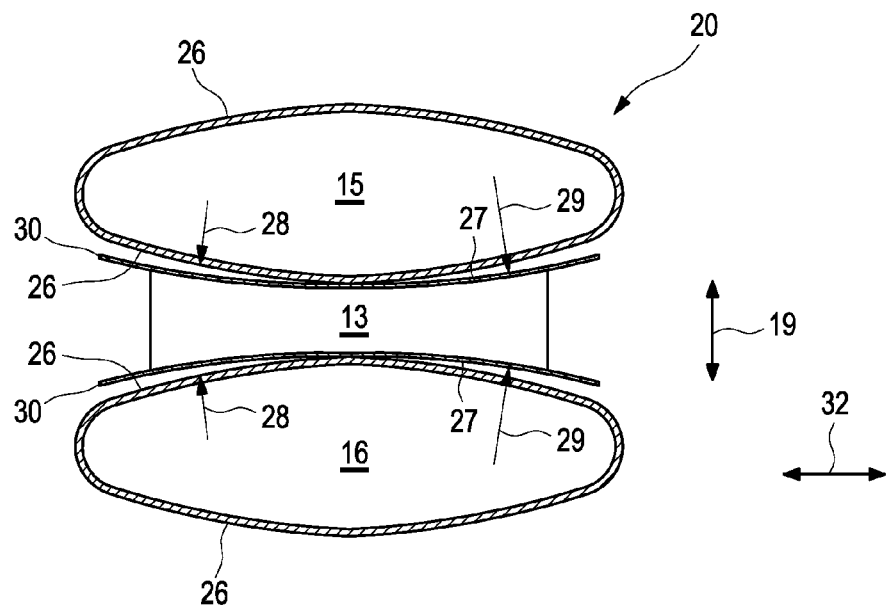
FIG. 3 is a highly simplified cross sectional view of the heat exchanger in the region of a thermoelectric module in a relaxed state.

FIG. 3 shows a detail of the stack 20 in the region of a single thermoelectric module 13 with the tubes 15 bordering thereon with missing preload force 22. In this relaxed state, a tube curvature radius 28 of the respective tube outside 26 is noticeably smaller than a module curvature radius 29 of the module outside 27. Because of this, contacting between the tubes 15, 16 and the thermoelectric module 13 initially occurs over a smaller area during the stacking Additionally, it is hinted in FIG. 3 that in the stacking direction 19 between the respective tube 15, 16 and the respective thermoelectric module 13 a heat conductive layer 30 can be arranged, so that no direct contacting between the tubes 15, 16 and the thermoelectric module 13 takes place. The tube outsides 26 are rather only indirectly in contact with the respective module outside 27 via the respective heat conductive layer 30.

Figure 4:
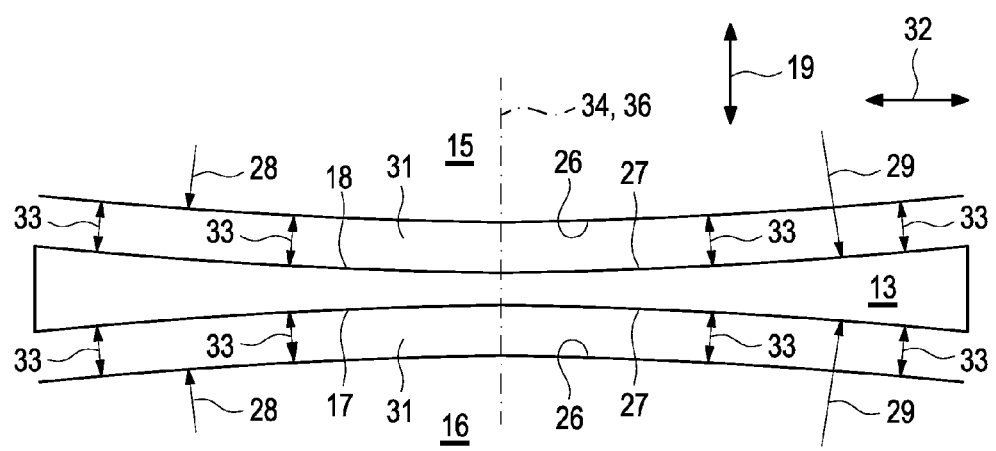
FIG. 4 is a further simplified cross sectional view of the heat exchanger in the region of the thermoelectric module, however in the clamped state.

The respective convex tube outside 26 is practically configured spring-elastically, so that it is spring-elastically deformable through the preload force 22 in such a manner that the tube curvature radius 28 becomes larger through the deformation. The tube curvature radius 28 in the preloaded state according to FIG. 4 is clearly larger than in the relaxed state with missing preload force. Furthermore, the concave module outside 27 compared with the tube outside 26 is rigid, so that during the preloading of the stack 20 the module outside 27 does not deform or only significantly less so than the respective tube outside 26. In particular, a situation can arise because of this in the preloaded state according to FIG. 4 in which the tube curvature radius 28 is substantial identical in size as the jacket curvature radius 29. Because of this, a gap 31 which in FIG. 4 is shown greatly enlarged in the stacking direction 19 is homogenized, so that it has a substantially constant gap width 33 over the entire transverse direction 32 of the stack 20. The respective gap 31 is only present in particular when a heat conductive layer 30 is provided, wherein the heat conductive layer 30 then substantially completely fills out the gap 31. If by contrast such a heat conductive layer 30 is missing, the gap width 33 is largely reduced to the value zero, so that the respective tube outside 26 then directly contacts the module outside 27 over the entire width of the thermoelectric module 13.

In the embodiments shown here, both the hot side 17 and also the cold side 18 each form such a concave module outside 27 on the respective thermoelectric module 13. Also conceivable is an embodiment in which either only the hot side 17 or only the cold side 18 forms such a concave module outside 27, for example for terminating the stack 20. Insofar however as tubes 15, 16 are arranged located on the stack 20 on the outside, the respective tube 15, 16 located on the outside, preferentially a cooling tube 15, can be configured so that it has a curved outside 27 only on the side facing the stack 20, while on its side facing away from the stack 20 it also has a flat outside, which can then contact the respective end plate 23, as a result of which the adapter pieces 25 which are curved on one side according to FIG. 2 can be omitted.

Figure 5:
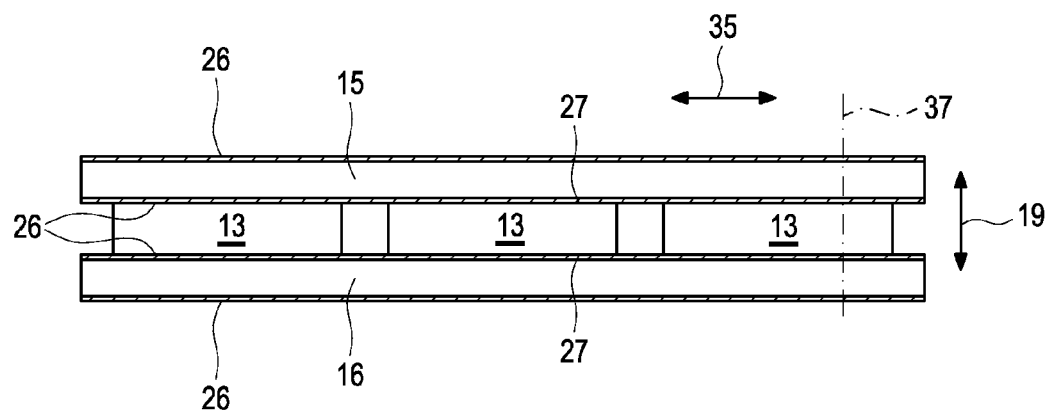
FIG. 5 is a highly simplified longitudinal sectional view through the heat exchanger in the region of the thermoelectric module in the clamped state, showing one of different embodiments.
Figure 6:
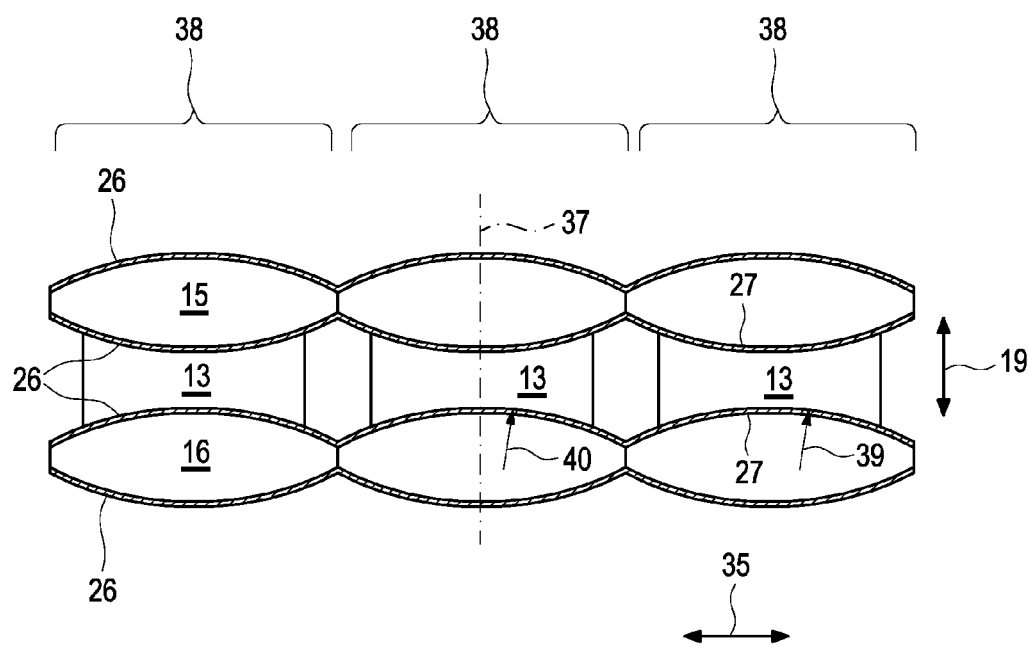
FIG. 6 is a highly simplified longitudinal sectional view through the heat exchanger in the region of the thermoelectric module in the clamped state, showing another of different embodiments.

In FIG. 4, a longitudinal center plane 34 is drawn in, which extends parallel to the stacking direction 19 and parallel to a longitudinal direction 35 of the stack 20, wherein this stack longitudinal direction 35 is only noticeable in FIGS. 5 and 6. With respect to this longitudinal center plane 34, the curvatures or the curved outsides 27, 28 are configured mirror-symmetrically.

According to FIGS. 5 and 6, multiple thermoelectric modules 13 can be arranged between a heating tube 16 and a cooling tube 15 in the stack longitudinal direction 35, one behind the other. Here, the respective module outside 27 with each of these individual thermoelectric modules 13 is concavely curved in the described manner.

FIGS. 5 and 6 show longitudinal sections of the stack 20 in the region of a cooling tube 15 and of a heating tube 16 and of the thermoelectric modules 13 arranged in between. The longitudinal section plane is shown in FIG. 4 and marked with 36. The longitudinal section plane 36 extends parallel to the stacking direction 19 and parallel to the stack longitudinal direction 35. The longitudinal section plane 36 thus extends parallel to the longitudinal center plane 34. In particular, the longitudinal center plane 34 and the longitudinal section plane 36 can coincide as shown in FIG. 4. In FIGS. 5 and 6, a cross-sectional plane 37 is additionally drawn in which extends parallel to the stacking direction 19 and parallel to the stack transverse direction 32. The sectional views of FIGS. 3 and 4 lie in such a cross-sectional plane 37.

In the embodiment shown in FIG. 5 the curved tube outsides 26 and the curve module outsides 27 are curved in the cross-sectional plane 37 and embodied linear in the longitudinal section plane 36. Because of this, the outsides 26, 27 are each given a cylinder segment-shaped curvature. In other words, the cross-sectional profile reflected in FIGS. 3 and 4 is substantially constant in the stack longitudinal direction 35.

In contrast with this, FIG. 6 shows an embodiment in which the curved tube outsides 26 and the curved module outsides 27 are curved both in the cross-sectional plane 37 and also in the longitudinal section plane 36. In this longitudinal section plane 36 the respective curved module outside 27 then likewise has a curvature radius 39. The respective tube 15, 16 also has a curvature radius 40 in the longitudinal section plane 36. Here, the curvature radii 39, 40 of the curved outsides 26, 27 located in the longitudinal center plane 36 can be identical in size in the preloaded state as the curvature radii 28, 29 of the outsides 26, 27 located in the cross-sectional plane 37. Because of this, the curved outsides 26, 27 are given a spherical segment-shaped curvature each at least in sections. Likewise, in an alternative embodiment, the curvature radii 39, 40 of the curved outsides 26, 27 located in the longitudinal section plane 36 and the curvature radii 28, 29 of the outsides 26, 27 located in the cross-sectional plane 37 can be unequal in the preloaded state. In this case, the curved outsides 26, 27 are each driven an ellipsoid segment-shaped curvature at least in sections. In both cases, the cross-sectional geometries of FIGS. 3 and 4 vary in the stack longitudinal direction 35.

FIG. 6 shows a special embodiment in which the cooling tube 15 and the heating tube 16 have multiple longitudinal sections 28 in the stack longitudinal direction 35, which are indicated in FIG. 6 by braces. The respective thermoelectric module 13 is arranged within the respective longitudinal section 38. Accordingly, these longitudinal sections 38 are arranged one behind the other in the stack longitudinal direction 35 and each assigned to a thermoelectric module 13. Within these longitudinal sections 38 the tube outside 26 is curved in the cross-sectional plane 37 and in the longitudinal section plane 36.

While specific embodiments of the invention have been shown and described in detail to illustrate the application of the principles of the invention, it will be understood that the invention may be embodied otherwise without departing from such principles.

The invention claimed is:

1. A heat exchanger, for an exhaust system of an internal combustion engine, the heat exchanger comprising:
    a plurality of thermoelectric modules for converting thermal energy into electrical energy, each of the thermoelectric modules comprises a hot side and a cold side;
    a plurality of cooling tubes for conducting a cooling fluid, each of the respective cooling tubes being arranged on the cold side of a respective one of the thermoelectric modules;
    a plurality of heating tubes for conducting a heating fluid, each of the respective heating tubes being arranged on the hot side of a respective one of the thermoelectric modules, wherein:
    each of the thermoelectric modules is disposed adjacent to and between one of the cooling tubes and one of the heating tubes forming a stack of the plurality of thermoelectric modules, the plurality of cooling tubes and the plurality of heating tubes along a stacking direction;
    the cooling tubes and the heating tubes are curved on a tube outside to form a curved tube outside facing an adjacent one of the thermoelectric modules;
    each of the thermoelectric modules, which is adjacent to the curved tube outside of the at least one of the tubes in the stacking direction, is curved in a same direction as the curved tube outside, on a respective curved module outside.

2. The heat exchanger according to claim 1, wherein at least one of:
    the curved tube outside is convexly curved towards the adjacent thermoelectric module and the facing curved module outside of the adjacent thermoelectric module is concavely curved towards the at least one of the tubes; and
    the curved tube outside is concavely curved towards the adjacent thermoelectric module and the facing curved module outside of the adjacent thermoelectric module is convexly curved towards the tube.

3. The heat exchanger according to claim 1, wherein the curved tube outside and the curved module outside, with respect to a longitudinal center plane of the stack, running parallel to the stacking direction, are configured mirror-symmetrically.

4. The heat exchanger according to claim 1, wherein the curved tube outside and the curved module outside is curved in a cross-sectional plane running parallel to the stacking direction and perpendicular to a longitudinal direction of the stack and is linear in a longitudinal section plane running parallel to the stacking direction and perpendicularly to a transverse direction of the stack.

5. The heat exchanger according to claim 1, wherein in the stacking direction, between the respective tube and the respective thermoelectric module, a heat conductive layer is arranged.

6. The heat exchanger for an exhaust system of an internal combustion engine, the heat exchanger comprising:
    at least one thermoelectric module for converting thermal energy into electrical energy, which at least one thermoelectric module comprises a hot side and a cold side;
    at least one cooling tube for conducting a cooling fluid, which is arranged on the cold side of at least one such thermoelectric module;
    at least one heating tube for conducting a heating fluid, which is arranged on the hot side of at least one such thermoelectric module, wherein:
    the at least one thermoelectric module, the at least one cooling tube and the at least one heating tube are disposed adjacent to one another in a stacking direction and form a stack;
    at least one of the cooling tube or the heating tube is curved on a tube outside to form a curved tube outside facing the thermoelectric module;
    the at least one thermoelectric module, which is adjacent to the curved tube outside of the at least one of the cooling tube or the heating tube in the stacking direction, is curved in a same direction as the curved tube outside, to provide a curved module outside facing the curved tube outside, wherein the curved tube outside is configured spring-elastically and is spring-elastically deformable through a preload force, which in a preloaded state of the stack compresses the stack in the stacking direction in such a manner that the curved tube outside in the preloaded state has a larger curvature radius than in a relaxed state, in which the preload force is missing.

7. The heat exchanger according to claim 6, wherein the curved module outside compared with the curved tube outside is rigid, so that during the preloading of the stack the curved tube outside is more strongly deformed than the curved module outside.

8. The heat exchanger according to claim 1, wherein the curved tube outside and the curved module outside are curved both in a cross-sectional plan, running parallel to the stacking direction and perpendicularly to a longitudinal direction of the stack, and also in a longitudinal section plane running parallel to the stacking direction and perpendicularly to a transverse direction of the stack.

9. The heat exchanger according to claim 8, wherein the respective heating tube and the respective cooling tube that are adjacent the thermoelectric modules are arranged one behind the other in the longitudinal direction of the stack, wherein the respective heating tube and cooling tube comprises multiple longitudinal sections, which are arranged one behind the other in the stack longitudinal direction.

10. A heat exchanger for an exhaust system of an internal combustion engine, the heat exchanger comprising:
  at least one thermoelectric module for converting thermal energy into electrical energy, which at least one thermoelectric module comprises a hot side and a cold side;
  at least one cooling tube for conducting a cooling fluid, which is arranged on the cold side of at least one such thermoelectric module;
  at least one heating tube for conducting a heating fluid, which is arranged on the hot side of at least one such thermoelectric module, wherein:
  the at least one thermoelectric module, the at least one cooling tube and the at least one heating tube are disposed adjacent to one another in a stacking direction and form a stack;
  at least one of the cooling tube or the heating tube is curved on a tube outside to form a curved tube outside facing the thermoelectric module;
  the at least one thermoelectric module, which is adjacent to the curved tube outside of the at least one of the cooling tube or the heating tube in the stacking direction, is curved in a same direction as the curved tube outside, to provide a curved module outside facing the curved tube outside, wherein at least one of:
  the curved tube outside is convexly curved towards the adjacent thermoelectric module and the facing curved module outside of the adjacent thermoelectric module is concavely curved towards the at least one of the tubes; and
  the curved tube outside is concavely curved towards the adjacent thermoelectric module and the facing curved module outside of the adjacent thermoelectric module is convexly curved towards the tube and, wherein
  without a preload force, which in a preloaded state of the stack compresses the stack in the stacking direction, a curvature radius of the curved tube outside and a curvature radius of the curved module outside are different.

11. The heat exchanger according to claim 10, wherein the curvature radius of the curved tube outside is smaller than the curvature radius of the curved module outside.

12. The heat exchanger according to claim 10, wherein in the preloaded state the curvature radius of the curved tube outside is substantially identical in size as the curvature radius of the curved module outside.

13. The heat exchanger for an exhaust system of an internal combustion engine, the heat exchanger comprising:
  at least one thermoelectric module for converting thermal energy into electrical energy, which at least one thermoelectric module comprises a hot side and a cold side;
  at least one cooling tube for conducting a cooling fluid, which is arranged on the cold side of at least one such thermoelectric module;
  at least one heating tube for conducting a heating fluid, which is arranged on the hot side of at least one such thermoelectric module, wherein:
  the at least one thermoelectric module, the at least one cooling tube and the at least one heating tube are disposed adjacent to one another in a stacking direction and form a stack;
  the cooling tube and the heating tube are curved on a tube outside to form a curved tube outside facing the thermoelectric module;
  the at least one thermoelectric module, which is adjacent to the respective curved tube outside of the cooling tube and the heating tube in the stacking direction, is curved in a same direction as the curved tube outside, to provide a curved module outside facing the curved tube outside, wherein the hot side and the cold side each form a curved module outside.

14. An internal combustion engine for a motor vehicle, the internal combustion engine comprising:
  an engine block, which comprises multiple combustion chambers;
  an exhaust system for discharging exhaust gas from the combustion chambers;
  a cooling circuit for cooling the engine block,
  a heat exchanger comprising:
  a plurality of thermoelectric modules for converting thermal energy into electrical energy, each of the thermoelectric modules comprises a hot side and a cold side;
  a plurality of cooling tubes for conducting a cooling fluid, each of the respective cooling tubes being arranged on the cold side of a respective one of the thermoelectric modules;
  a plurality of heating tubes for conducting a heating fluid, each of the respective heating tubes being arranged on the hot side of a respective one of the thermoelectric modules, wherein:
  each of the thermoelectric modules is disposed adjacent to and between one of the cooling tubes and one of the heating tubes forming a stack of the plurality of thermoelectric modules, the plurality of cooling tubes and the plurality of heating tubes arranged along a stacking direction;
  the cooling tubes and the heating tubes are curved on a tube outside to form a curved tube outside facing an adjacent one of the thermoelectric modules;
  each of the thermoelectric modules, which is adjacent to the curved tube outside of the at least one of the tubes in the stacking direction is curved in a same direction as the curved tube outside, on a respective curved module outside, wherein the heating tube is fluidically incorporated in the exhaust system and the cooling tube is fluidically incorporated in the cooling circuit.

15. The internal combustion engine according to claim 14, wherein at least one of:
  the curved tube outside is convexly curved towards the adjacent thermoelectric module and the facing curved module outside of the adjacent thermoelectric module is concavely curved towards the at least one of the tubes; and
  the curved tube outside is concavely curved towards the adjacent thermoelectric module and the facing curved module outside of the adjacent thermoelectric module is convexly curved towards the tube.

16. The internal combustion engine according to claim 14, further comprising heat conductive layer arranged, in the stacking direction, between the curved tube outside and the curved module outside.

17. The internal combustion engine according to claim 15, wherein:

a preload force applying arrangement applies a preload force to provide a preloaded state in which the stack is compressed in the stacking direction;

without the preload force, a curvature radius of the curved tube outside and a curvature radius of the curved module outside are different.

18. The internal combustion engine according to claim 17, wherein the curvature radius of the curved tube outside is smaller than the curvature radius of the curved module outside.

19. The internal combustion engine according to claim 14, wherein:

the curved tube outside is configured spring-elastically and is spring-elastically deformable upon the application of a preload force;

a preload force applying arrangement applies a preload force to provide a preloaded state in which the stack is compressed in the stacking direction;

the curved tube outside, in the preloaded state, has a larger curvature radius than in a relaxed state, in which the preload force is missing.

20. The internal combustion engine according to claim 19, wherein the curved module outside, compared with the curved tube outside, is rigid, whereby in the a preloaded state, upon the application of the preload force, the curved tube outside is deformed more than the curved module outside.

* * * * *